US007849383B2

(12) United States Patent
Lin

(10) Patent No.: US 7,849,383 B2

(45) Date of Patent: Dec. 7, 2010

(54) SYSTEMS AND METHODS FOR READING NONVOLATILE MEMORY USING MULTIPLE READING SCHEMES

(75) Inventor: Jason T. Lin, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 599 days.

(21) Appl. No.: 11/767,587

(22) Filed: Jun. 25, 2007

(65) Prior Publication Data

US 2008/0320346 A1 Dec. 25, 2008

(51) Int. Cl.
*G11C 29/00* (2006.01)

(52) U.S. Cl. ........................................ 714/763; 365/220

(58) Field of Classification Search ................. 714/763; 365/220

See application file for complete search history.

(56) References Cited

U.S. PATENT DOCUMENTS 5,570,315 A 10/1996 Tanaka et al. .......... 365/185.22
5,657,332 A 8/1997 Auclair et al. ........... 371/40.11
5,774,397 A 6/1998 Endoh et al. ........... 365/185.19
6,046,935 A 4/2000 Takeuchi et al. ...... 365/ 185.03
6,151,246 A * 11/2000 So et al. ................ 365/185.09
6,529,407 B2 * 3/2003 Shukuri ................. 365/185.07
6,898,117 B2 * 5/2005 So et al. ................ 365/185.03
7,406,649 B2 * 7/2008 Shimizume et al. ......... 714/773
7,492,634 B2 * 2/2009 Li et al. ................. 365/185.03
7,495,953 B2 * 2/2009 Li ......................... 365/185.02
2001/0053092 A1 * 12/2001 Kosaka et al. .......... 365/185.19
2006/0221696 A1 10/2006 Li ......................... 365/185.12
2006/0221714 A1 10/2006 Li et al. ................. 365/189.01
2008/0082897 A1 4/2008 Brandman et al.
2008/0092026 A1 4/2008 Brandman et al.
2008/0320366 A1 12/2008 Lin

FOREIGN PATENT DOCUMENTS

WO WO 2007/049272 5/2007
WO WO 2009/002940 12/2008

OTHER PUBLICATIONS

International Search Report and Written Opinion of the International Searching Authority mailed Jan. 23, 2009 in Application No. PCT/US2008/067919.

"Soft Decoding of Hard and Soft Bits Read from a Flash Memory," *The IP.com Journal*, IP.com Inc., West Henrietta, NY, US. Mar. 4, 2007.

"Method for Generating Soft Bits in Flash Memories," *The IP.com Journal*, IP.com Inc., West Henrietta, NY, US. Mar. 4, 2007.

* cited by examiner

*Primary Examiner*—Esaw T Abraham
(74) *Attorney, Agent, or Firm*—Weaver Austin Villeneuve & Sampson LLP

(57) ABSTRACT

In a nonvolatile memory system, first raw data is obtained from stored data using a first set of reading parameters. Subsequently, the first raw data is transferred to an ECC circuit where it is decoded. While the first raw data is being transferred and decoded, second raw data is obtained from the same stored data using a second set of reading parameters.

22 Claims, 3 Drawing Sheets

SYSTEMS AND METHODS FOR READING NONVOLATILE MEMORY USING MULTIPLE READING SCHEMES

CROSS-REFERENCE TO RELATED APPLICATION

This application is related to U.S. patent application Ser. No. 11/767,582, filed on the same day as the present application, entitled, "Methods of Reading Nonvolatile Memory". This application is incorporated in its entirety by reference as if fully set forth herein.

BACKGROUND OF THE INVENTION

This invention relates to nonvolatile memories and methods of operating nonvolatile memories. In particular, this application relates to nonvolatile memory arrays in which floating gate memory cells individually hold one or more bits of data, and to methods of reading data from such cells.

Nonvolatile memory systems are used in various applications. Some nonvolatile memory systems are embedded in a larger system such as a personal computer. Other nonvolatile memory systems are removably connected to a host system and may be interchanged between different host systems. Examples of such removable memory systems include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®" USB flash drives are typically larger and shaped differently than the memory cards described above.

Different types of memory array architecture are used in nonvolatile memory systems. In one type of architecture, a NAND array, a series of strings of more than two memory cells, such as 16 or 32, are connected along with one or more select transistors between individual bit lines and a reference potential to form columns of cells. Word lines extend across cells within a large number of these columns.

An individual memory cell may hold one bit of data in what is known as a Single Level Cell (SLC) design. In some examples, a memory cell may hold two or more bits of data in what is known as a Multi Level Cell (MLC) design.

SUMMARY OF THE INVENTION

A method of reading data that is stored in a nonvolatile memory array according to an embodiment of the present invention comprises: performing first a read operation on a plurality of memory cells by individually comparing values of an electrical characteristic of each of the plurality of cells with a first at least one predetermined value to obtain first raw data that includes at least one bit from each of the plurality of cells; performing ECC decoding of the first raw data; while performing the ECC decoding of the first raw data, performing a second read operation on the plurality of memory cells by individually comparing values of the electrical characteristic of each of the plurality of cells with a second at least one predetermined value, that is different from the first at least one predetermined value to obtain second raw data that includes at least one bit from each of the plurality of cells; if the ECC decoding of the first raw data is not successful, then performing ECC decoding of the second raw data; and if the ECC decoding of the first raw data is successful, then discarding the second raw data without performing ECC decoding of the second raw data.

A method of reading data that is stored in a nonvolatile memory array according to an embodiment of the present invention comprises: reading a plurality of bits stored in the nonvolatile memory array using a first set of reading parameters to obtain a first set of raw data; performing ECC operations on the first set of raw data; and while performing ECC operations on the first set of raw data, reading the plurality of bits stored in the nonvolatile memory array using a second set of reading parameters to obtain a second set of raw data.

A method of reading data that is stored in a flash memory array according to an embodiment of the present invention comprises: performing a first read operation on a plurality of memory cells by individually comparing a threshold voltage of each of the plurality of cells with a first at least one reference voltage to obtain first raw data corresponding to data of a logical page stored in the plurality of memory cells; performing ECC decoding of the first raw data; while performing the ECC decoding of the first raw data, performing a second read operation on the plurality of memory cells by individually comparing the threshold voltage of each of the plurality of cells with a second at least one reference voltage, that is different from the first at least one reference voltage, to obtain second raw data corresponding to the data of the logical page stored in the plurality of cells; if the ECC decoding of the first raw data is not successful, then performing ECC decoding of the second raw data; and if the ECC decoding of the first raw data is successful, then outputting data obtained from decoding the first raw data and discarding the second raw data without performing ECC decoding of the second raw data.

A nonvolatile memory system according to an embodiment of the present invention comprises: a nonvolatile memory array that includes a plurality of memory cells that are read in parallel; a reading circuit that reads a plurality of bits of data stored in the plurality of memory cells according to a first reading scheme, to provide a first output, and reads the plurality of bits of data stored in the plurality of memory cells according to a second reading scheme, to provide a second output; and an ECC decoding circuit that is connected to the reading circuit, the ECC decoding circuit receiving the first output from the reading circuit and performing ECC decoding on the first output while the reading circuit reads the plurality of bits of data stored in the plurality of memory cells according to the second reading scheme.

A nonvolatile memory system according to an embodiment of the present invention comprises: a nonvolatile memory array that stores a plurality of pages of data; a reading circuit that has a plurality of reading modes, each of the plurality of reading modes comparing an electrical measurement from a memory cell with a different set of one or more predetermined values to provide an output, the reading circuit performing a plurality of read operations on a portion of data in a non-repeating sequence of modes until an end condition is indicated; and an ECC circuit that performs ECC decoding of each output of the reading circuit while the reading circuit performs a read operation on the portion of data in a subsequent mode in the sequence of modes, the ECC circuit providing a signal to the reading circuit indicating the end condition when the ECC circuit successfully decodes an output of the reading circuit.

DETAILED DESCRIPTION OF ILLUSTRATED EMBODIMENTS

Figure 1:
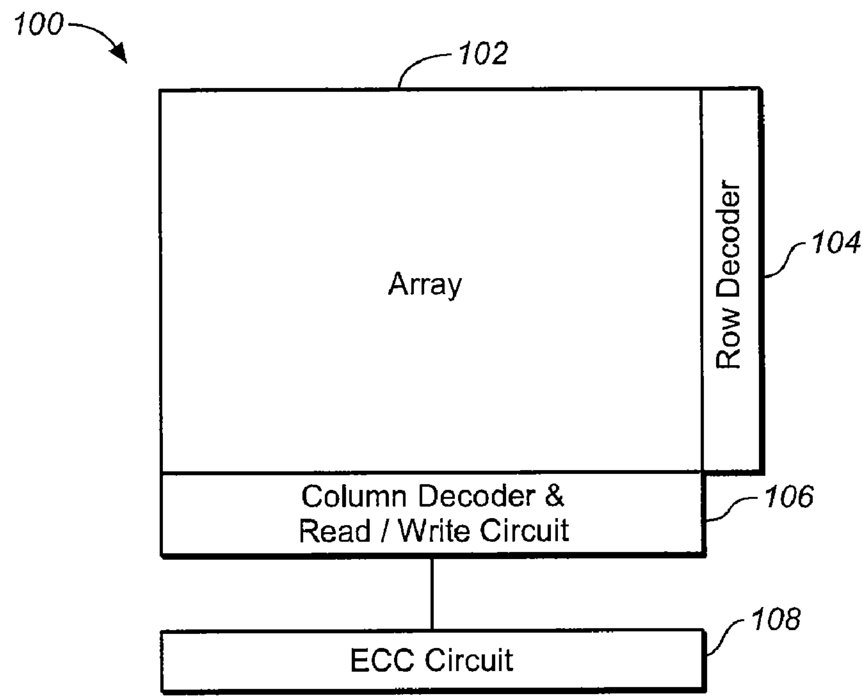
FIG. 1 shows a portion of a memory system including a nonvolatile memory array, decoder circuits and an ECC circuit.

FIG. 1 shows a portion of a nonvolatile memory system 100 according to an embodiment of the present invention. In particular, FIG. 1 shows an array of nonvolatile memory cells 102 that are used to store data. FIG. 1 also shows peripheral circuits 104, 106, 108 that are connected to array 102 and that are used in accessing the cells of memory array 102 for reading, writing and erasing data. Row decoder circuits 104 are connected to word lines, which extend in the horizontal direction. Column decoder and read/write circuits 106 are connected to bit lines, which extend in the vertical direction. Column decoder and read/write circuits 106 may include sense amplifiers, multiplexing circuits and one or more registers. While FIG. 1 shows a simple configuration, other configurations may also be used. Examples of such configurations are described in US Patent Pub. No. 2006/0221696.

Aspects of the present invention may be used with a variety of nonvolatile memory arrays. In one example, the memory array consists of flash memory cells, which individually include a transistor having a floating gate. Charge is placed on floating gates during programming according to the data to be stored in the cell, and the threshold voltage of the cell changes accordingly. A cell may be read by comparing the threshold voltage of the cell with a predetermined voltage. Examples of flash memory arrays include NOR and NAND arrays.

In a typical NOR array, cells in a column are connected between two bit lines and cells along a row have select gates that are connected together by a word line. In a typical NAND arrangement, cells are connected together in series to form a string with select transistors at each end of the strings. The string is connected to a bit line at one end (drain) and strings in a row are connected together at the other (source) end. Word lines extend to form control gates of memory cells. Examples of NAND architecture are provided in U.S. Pat. Nos. 5,570,315, 5,774,397 and 6,046,935.

In a NAND memory system, data is generally read from the memory array by sensing the currents or voltages of various bit lines when predetermined voltages are applied to word lines and select lines. In particular, one cell in a string has a read voltage applied to its control gate (through a word line), while all other cells are turned on by applying a sufficient voltage to their control gates. Thus, the cell being read controls the current flowing through the string and the resulting voltage on the bit line. The resulting current and voltage depend on the threshold voltage of the cell being read. The state of the cell and its threshold voltage may thus be read by sensing a current flowing through the cell, a voltage on the bit line or by sensing a time for a bit line to discharge through the cell. Even though these techniques may not directly measure threshold voltage, they measure a parameter that is dependent on the threshold voltage of the cell transistor and may be considered to indirectly sense the cell's threshold voltage.

FIG. 1 also shows an Error Correction Coding (ECC) circuit 108 that is connected to the column decoder and read/write circuit 106. The ECC circuit 108 may be located on the same die as the memory array 102, for example as a dedicated on-chip circuit, or may form part of a controller that is located on the same chip or on a different chip. ECC circuit 108 performs encoding and decoding operations on data. In particular, data that is to be stored is encoded prior to storage. Encoding generally involves transforming data so that there is some redundancy in the stored data and so that errors that may occur in the data when it is read may be detected and corrected. Various ECC schemes may be used including schemes that append a number of bits (e.g. parity bits) and schemes that transform some or all data bits. Simple Error Correction Codes encode data by storing additional parity bits, which set the parity of groups of bits to a required logical value when the data is written into the memory system. Upon reading the data from the memory system, the parity of the group of bits is computed once again by the ECC. Because of data corruption the computed parity may not match the required parity condition, and the ECC may detect the corruption. ECC may be applied on a sector by sector basis so that each sector is stored with some additional redundant bits. For example, a sector having 512 bytes of data may have 8 bytes of ECC data appended prior to storage. In general, the more redundant bits used, the higher the number of errors that can be detected and corrected.

ECCs can have at least two functions: error detection and error correction. Capability for each of these functions is typically measured in the number of bits that can be detected as erroneous and subsequently corrected. Detection capability can be the same or greater than the correction capability. A typical ECC can detect a higher number of error bits than it can correct. A collection of data bits and parity bits is sometimes called a word. An early example is the (7,4) Hamming code, which has the capability of detecting up to two errors per word (seven bits in this example) and has the capability of correcting one error in such a seven-bit word.

More sophisticated ECCs can correct more than a single error per word, but it becomes computationally increasingly complex to reconstruct the data. Common practice is to recover the data with some acceptably small likelihood of incorrect recovery. However with increasing number of errors the probability of reliable data recovery also decreases rapidly or the associated costs in additional hardware and/or performance become prohibitively high.

When data is read that has an uncorrectably high number of errors, a second attempt may be made to read the data. For example, a different set of reading conditions may be applied to see if the different reading conditions provide data with a lower number of errors that is correctable. A memory system may go through multiple attempts to read data in this manner until a particular set of reading parameters provides good enough data (ECC correctable data).

Figure 2:
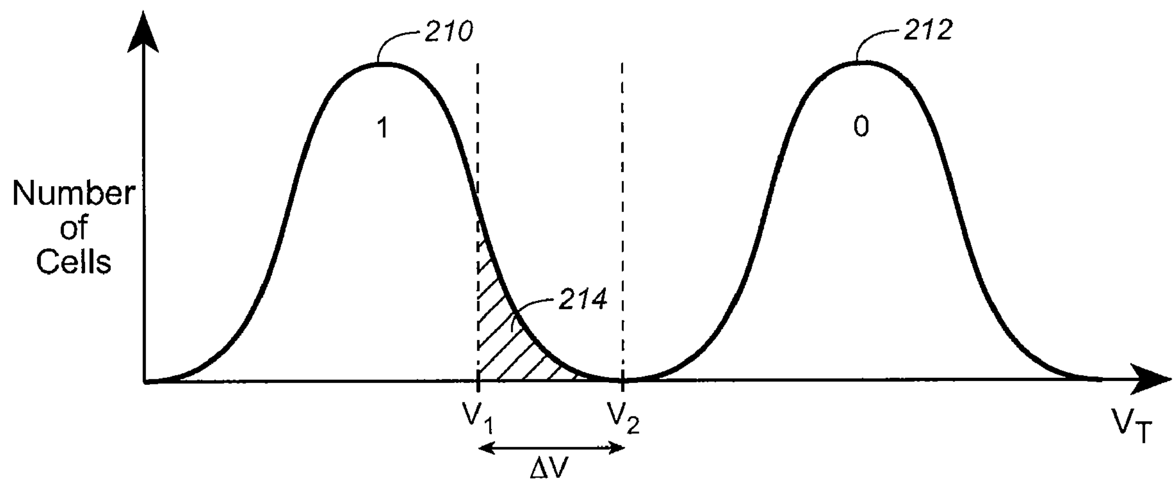
FIG. 2 shows distributions of cells programmed to logic 0 and logic 1 states in a nonvolatile memory array and voltages used to determine the states of the cells.

FIG. 2 shows an example of how different reading parameters may be used. FIG. 2 shows threshold voltages ($V_T$) of memory cells that are programmed to two different memory states, a logic 0 state and a logic 1 state. In this example, cells storing a logic 1 (represented by distribution 210) have a lower threshold voltage and cells storing a logic 0 (represented by distribution 212) have a higher threshold voltage. The logic 1 threshold voltage may simply be the threshold voltage corresponding to the erased state so that cells storing logic 1 maintain the same threshold voltage during programming.

Reading data in memory cells generally involves comparing the threshold voltages of the cells with some predetermined voltage or voltages. In one example, a first discrimination voltage V1 is used to perform a first read. This means that all cells with a threshold voltage less than V1 are considered to store a 1, while all cells with a threshold voltage greater than V1 are considered to store a 0. This means that cells in the shaded portion 214 of distribution 210 of cells programmed to the logic 1 state are erroneously read as being in the logic 0 state. This may provide data with a significant number of errors. In particular, this may provide data that has a number of errors that is uncorrectable by the ECC scheme used.

Where ECC decoding determines that there is an uncorrectably large number of errors in the data, a second read may be performed using different reading parameters. In the present example, a second read is performed using V2 as the discrimination voltage. This results in cells in the shaded portion 214 being correctly identified as containing a 1. Thus, the number of errors is reduced to an acceptable number and the data may be fully corrected by ECC.

The discrimination voltage is adjusted from V1 to V2 by an amount ΔV in this example. The direction of adjustment (increase or decrease) and the magnitude of adjustment may be determined in any suitable manner. An adjustment may be based on expected changes in memory cell characteristics due to wear over the lifetime of the cell, or based on measured changes in cell characteristics. In one example, reference cells are used to track changes that may occur over the lifetime of a memory array and adjusted reading parameters may be based on changes observed in reference cells of the same device. In another example, corrections made by the ECC circuit are subjected to statistical analysis to detect patterns in memory cell behavior and to adjust reading parameters accordingly during the lifetime of the device. Failure analysis on devices may also provide information regarding changing distributions of threshold voltage over time, so that some predictions may be made and suitable adjustments calculated, based on wear. For example, adjustments may be based on the number of erase cycles experienced by a block or other unit. Computer simulation may be used to obtain suitable adjustments for memory reading parameters. Adjustment may be made on a page-by-page basis, block-by-block basis, for all blocks of a device together, or for some other unit of memory. Thus, in a memory system that uses some default discrimination voltage (e.g. V1) to read a page, the actual discrimination voltage used (e.g. V2) may vary throughout the lifetime of the device and may be different for different pages within the device. In one example, a first read operation is performed using a default discrimination voltage such as V1 and only if ECC indicates that the data obtained from the first read is not correctable by ECC, a second read is performed using a different discrimination voltage such as V2. In other examples, multiple different discrimination voltages may be used until the data read is correctable.

Figure 3:
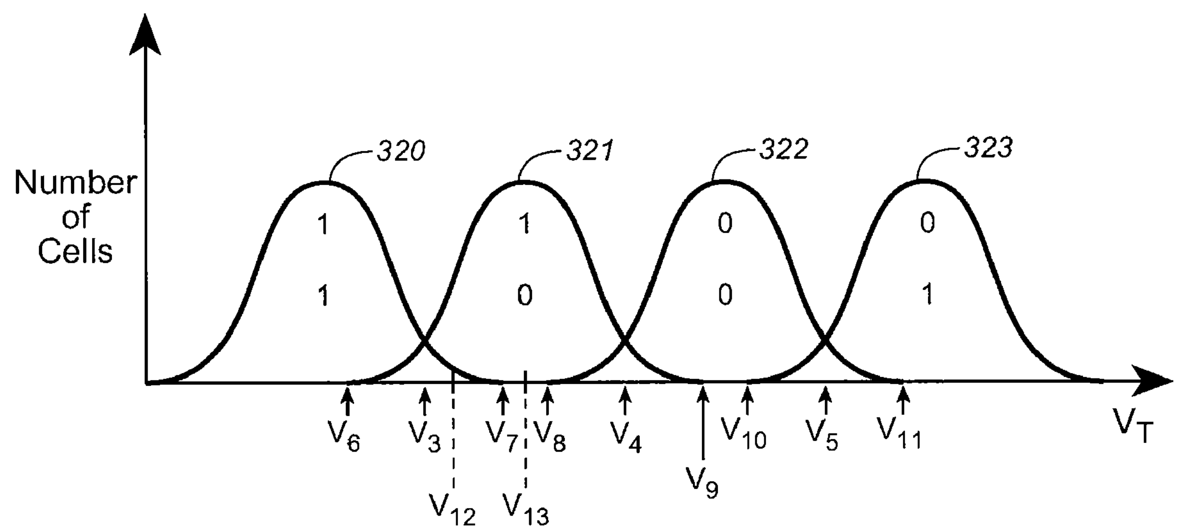
FIG. 3 shows distributions of cells programmed to different logic states in a MLC memory array and voltages used to determine the states of the cells.

FIG. 3 shows another example of threshold voltage distributions 320-323 for different logic states in a nonvolatile memory. In this case, individual cells are programmed to one of four states, so each cell stores two bits of data in what may be referred to as a Multi Level Cell (MLC) memory. Other MLC designs store more than two (e.g. four) bits per cell. Generally, as the number of bits per cell increases, the threshold voltage range assigned to each memory state becomes smaller and the risk of misreading data increases. FIG. 3 shows some overlap between distributions 320-323 for different memory states. Some overlap is acceptable because ECC may correct errors up to some limit. However, if too many errors are present in data read from the memory then ECC is unable to correct the data. Therefore, using the right discrimination voltages is important. In a first read operation, discrimination voltages V3, V4, and V5 are used to identify the memory state of each cell. Discrimination voltages V3, V4, and V5 may be default voltages, or may be subject to some offset, or set of offsets, from default voltages as described above. In a second read operation, discrimination voltages V6, V7, V8, V9, V10, V11 are used to further resolve threshold voltages of cells. The second read operation may be considered a higher resolution read than the first read operation. The second read operation provides an indication of the probability that the result of the first read operation was correct. For example, cells having threshold voltages V12 and V13 are both identified as storing (1,0) in a first read (threshold voltage between V3 and V4). In a second read, the cell with threshold voltage V12 is identified as having a relatively low probability of being correctly read because its threshold voltage is where distributions 320 and 321 overlap (between V3 and V7). In the second read, the cell with threshold voltage V13 is identified as having a relatively high probability of being correctly read because its threshold voltage is in the center of distribution 321 (between V7 and V8) where there is little or no overlap with other distributions. This probability information may be used in performing ECC correction as described in U.S. patent application Ser. Nos. 11/536,286 and 11/536,327. In some cases, additional read operations are performed with higher resolution until ECC correctable data is obtained.

In one arrangement, data from a page in a nonvolatile memory array is initially read into a register that is part of the read/write circuit. The data is then transferred to an ECC circuit for decoding. The memory system may wait for the ECC decoding to be completed before performing any additional read operation. If the decoding is successful (all errors corrected by ECC), then the memory system reads the next page of data. If the ECC decoding is not successful (too many errors to correct by ECC), then the memory system re-reads the same data using different read parameters (e.g. using different discrimination voltage/voltages). For example, one or more discrimination voltages may be offset, or a read may be performed using a higher resolution.

In one example, to increase speed, a second read of the same data is initiated while the output from a first read of the data (first raw data) is being transferred to the ECC circuit and while ECC decoding is being performed. In this way, if ECC decoding of the first output data is not successful, ECC decoding of the second output data (second raw data) may be performed without waiting for the data to be read a second time. This may be considered a form of read caching.

Figure 4:
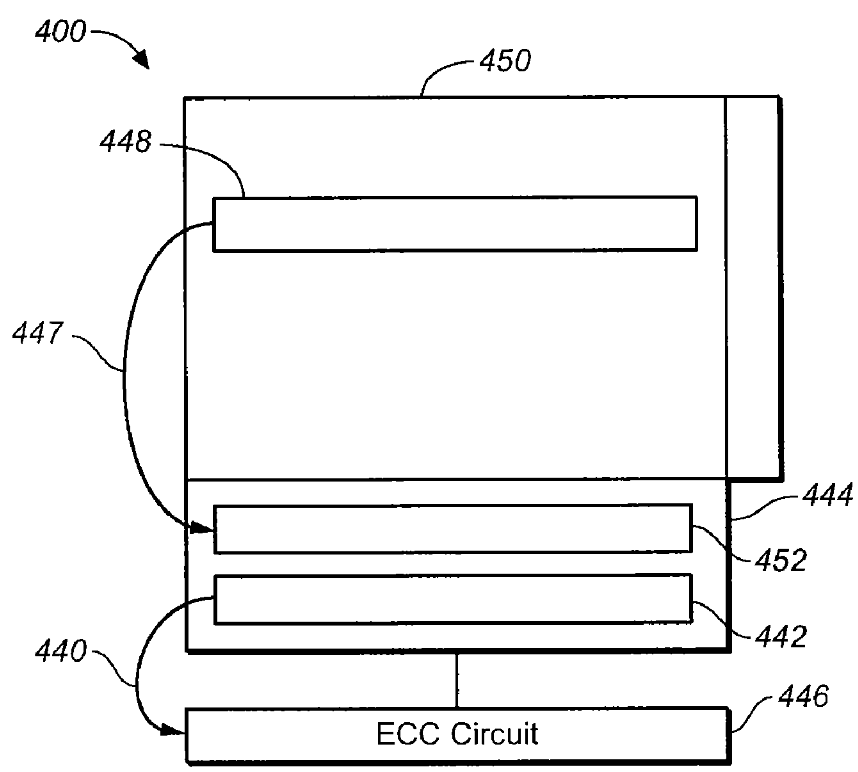
FIG. 4 shows a portion of a memory system with two operations being performed in parallel, transferring data that was read using first reading parameters to the ECC circuit and reading the same data using second reading parameters.

FIG. 4 shows an example of a portion of a memory system 400 in which two operations are performed in parallel. In a first operation 440, data from a first read (first raw data) is transferred from a register 442 in the read/write circuits 444 to the ECC circuit 446 where the data is decoded. At the same time, a second operation 447 is performed to read the same data using different reading parameters to the first read. The second raw data is read from a page 448 in memory array 450 into another register 452 in read/write circuit 444. Both transfer of the data from the first read and ECC decoding may performed in parallel with the second read, or just one of these operations may be performed in parallel. In either case, at least some further handling of the data from the first read is performed in parallel with performing the second read.

It should be noted that the same bits of data are read in both the first and second read in the example of FIG. 4. Thus, first raw data and second raw data correspond to the same stored data bits, though because of different reading parameters used, first raw data and second raw data may contain different bits. In another example, data may be read from a second page while data from a first page is being transferred or decoded. In yet another example, MLC memory holds more than one logical page of data in a single physical page of a memory array and while one logical page of data is being transferred and/or decoded, another logical page of data may be read from the same physical page. In this case, though the same cells are read in both read operations, different bits of data are being read. For example, in memory storing two bits per cell (see example of FIG. 3) one bit may be considered the lower bit and one the upper bit. The lower bits of a physical page may be considered a lower logical page and the upper bits of a physical page may be considered an upper logical page. In MLC memories, it may be efficient to read subsequent logical pages while decoding previous logical pages from the same physical page. In contrast, memory system 400 of FIG. 4 reads the same bits of data (upper or lower page) in both read operations.

In some cases, two read operations are sufficient to obtain ECC correctable data. In other cases, three or more read operations may be needed. In one example, successive read operations are performed with different reading parameters until ECC correctable data is obtained or some limit is reached.

Figure 5:
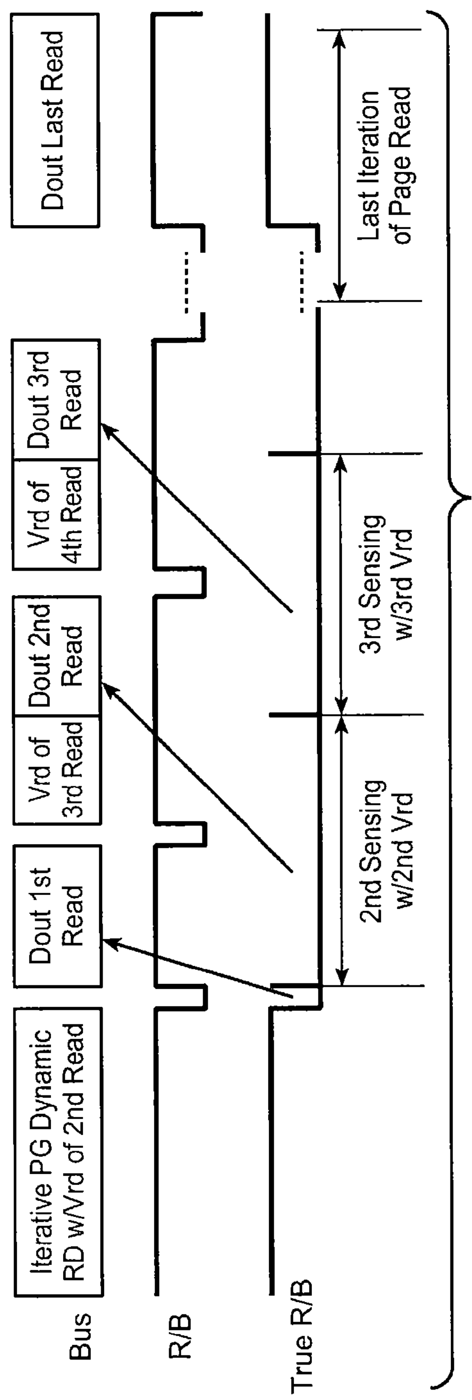
FIG. 5 shows an example of reading a page of data using different reading parameters in different iterations and outputting the data from one read while performing a subsequent read.

FIG. 5 shows an example of parallel operation where a page of data is read from a memory array using a sequence of different read parameters, and while each read is performed, data from an earlier read of the same page is transferred to the ECC circuit where ECC decoding is performed. FIG. 5 shows communication on a bus ("Bus" line) to the memory and read/busy ("R/B" "True R/B") during a series of iterative reads of the same data. In particular, FIG. 5 shows first read data being transferred "Dout $1^{st}$ read" in parallel with $2^{nd}$ sensing using a $2^{nd}$ reading voltage ($2^{nd}$ Vrd) that is different to the first reading voltage. After the first read data is transferred, and prior to transfer of the second data, a third read voltage "Vrd of $3^{rd}$ read" is sent to the read/write circuit (for example, from a memory controller). The third read voltage may be determined by any suitable scheme. Subsequently, this voltage is used to perform a third sensing ("$3^{rd}$ sensing w/$3^{rd}$ Vrd") that occurs in parallel with the transfer of second read data "Dout $2^{nd}$ Read." A number of iterations are performed in this way, with different read voltages used in each iteration. Iterations may be performed until data is read that is ECC correctable. There may be a limit on the number of iterations allowed so that the page is considered to be uncorrectable if the limit is reached.

Figure 6:
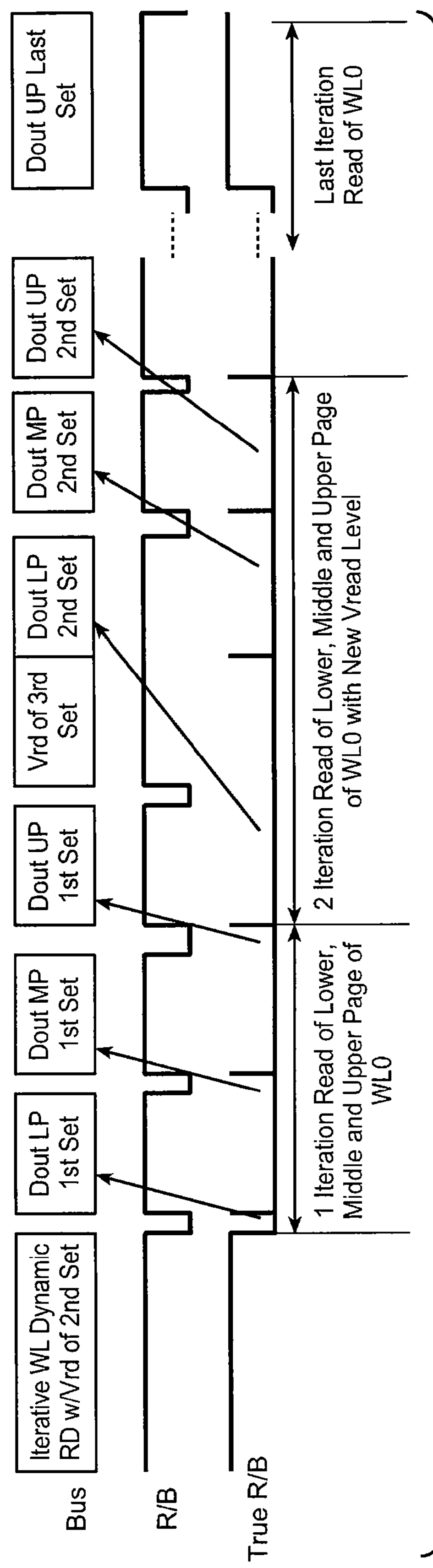
FIG. 6 shows an example of reading three logical pages of data using different reading parameters in different iterations and outputting data from one read while performing a subsequent read.

FIG. 6 shows an example of reading a physical page of an MLC memory that contains three logical pages of data (lower, middle and upper page of word line WL0). In a first iteration, the lower middle and upper pages are read using a first set of read voltages and the data obtained by this read operation is output to the ECC circuit. Reading of a logical page may occur in parallel with outputting the data of the previous logical page to the ECC circuit. When reading of the first iteration ends, reading of the second iteration begins using a second set of read voltages that was previously supplied to the read/write circuit (Vrd of $2^{nd}$ set). Subsequently, when the reading of the second iteration ends, reading of a third iteration begins, using a third set of read voltages. Iterations continue until a final iteration. The process may terminate because ECC correctable data is read, or because some maximum number of iterations is reached.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. A nonvolatile memory system comprising:

a nonvolatile memory array that includes a plurality of memory cells that are configured to be read in parallel;

a reading circuit that is configured to read a plurality of bits of data stored in the plurality of memory cells according to a first reading scheme, to provide a first output, and read the plurality of bits of data stored in the plurality of memory cells according to a second reading scheme, to provide a second output; and an ECC decoding circuit that is connected to the reading circuit, the ECC decoding circuit being configured for receiving the first output from the reading circuit and performing ECC decoding on the first output while the reading circuit reads the plurality of bits of data stored in the plurality of memory cells according to the second reading scheme.

2. The nonvolatile memory system of claim 1 wherein each of the plurality of cells holds two or more bits.

3. The nonvolatile memory system of claim 1 wherein reading a cell according to a first reading scheme comprises comparing a voltage obtained from the cell with a predetermined voltage.

4. The nonvolatile memory system of claim 1 wherein reading a cell according to a first reading scheme comprises comparing a current obtained from the cell with a predetermined current.

5. The nonvolatile memory system of claim 1 wherein the memory array includes memory cells connected together in series to form NAND strings.

6. The nonvolatile memory system of claim 1 wherein the reading circuit has additional reading schemes and, while the reading circuit performs reading according to a current reading scheme, the ECC decoding circuit performs decoding of an output of a previous reading scheme that was previously used to read the plurality of bits of data.

7. The nonvolatile memory system of claim 1 wherein the ECC decoding circuit is within a memory controller.

8. The nonvolatile memory system of claim 1 wherein the ECC decoding circuit is a dedicated circuit that is connected to the reading circuit.

9. A method of reading data that is stored in a nonvolatile memory array comprising:

performing first a read operation on a plurality of memory cells by individually comparing values of an electrical characteristic of each of the plurality of cells with a first at least one predetermined value to obtain first raw data that includes at least one bit from each of the plurality of cells;

performing ECC decoding of the first raw data;

while performing the ECC decoding of the first raw data, performing a second read operation on the plurality of memory cells by individually comparing values of the electrical characteristic of each of the plurality of cells with a second at least one predetermined value, that is different from the first at least one predetermined value to obtain second raw data that includes at least one bit from each of the plurality of cells;

if the ECC decoding of the first raw data is not successful, then performing ECC decoding of the second raw data; and if the ECC decoding of the first raw data is successful, then discarding the second raw data without performing ECC decoding of the second raw data.

10. The method of claim 9 further comprising, while performing the ECC decoding of the second raw data, performing a third read operation on the plurality of memory cells by individually comparing values of the electrical characteristic of each of the plurality of cells with a third at least one predetermined value, that is different from the first and second at least one predetermined value, to obtain third raw data that includes at least one bit from each of the plurality of cells.

11. The method of claim 10 wherein, if the decoding of the second raw data is successful, then discarding the third raw data without performing ECC decoding of the third raw data.

12. The method of claim 11 further comprising, if the decoding of the second raw data is not successful, then performing ECC decoding of the third raw data and discarding the second raw data.

13. The method of claim 10 further comprising performing at least one additional read operation on the plurality of memory cells by individually comparing values of the electrical characteristic of each of the plurality of cells with an additional at least one predetermined value, to obtain additional raw data that includes at least one bit from each of the plurality of cells, each of the additional read operations performed in parallel with ECC decoding of data from a previously performed read operation.

14. The method of claim 10 wherein the difference between the first at least one predetermined value and the second at least one predetermined value is determined from a predicted change in the electrical characteristic.

15. The method of claim 9 wherein the electrical characteristic is threshold voltage of a floating gate memory cell and the first at least one predetermined value is a threshold voltage value that corresponds to a mid point between threshold voltage ranges associated with two memory states.

16. The method of claim 9 wherein the electrical characteristic is threshold voltage of a floating gate memory cell and the first at least one predetermined value is a plurality of threshold voltage values that correspond to mid points between threshold voltage ranges associated with more than two memory states.

17. The method of claim 9 wherein the second read is initiated while the first raw data is being transferred.

18. A method of reading data that is stored in a nonvolatile memory array comprising:

reading a plurality of bits stored in the nonvolatile memory array using a first set of reading parameters to obtain a first set of raw data;

performing ECC operations on the first set of raw data; and while performing ECC operations on the first set of raw data, reading the plurality of bits stored in the nonvolatile memory array using a second set of reading parameters to obtain a second set of raw data.

19. The method of claim 18 wherein the first set of reading parameters includes at least a first predetermined voltage that is compared with a voltage derived from a cell of the nonvolatile memory array.

20. The method of claim 19 wherein the second set of reading parameters includes at least a second predetermined voltage that is compared with the voltage derived from the cell of the nonvolatile memory array, the second voltage being selected according to an expected change in threshold voltage of the cell.

21. The method of claim 18 further comprising, if the performing ECC operations on the first set of raw data is not successful, then performing ECC operations on the second set of raw data while reading the plurality of bits stored in the nonvolatile memory array using a third set of reading parameters to obtain a third set of raw data.

22. The method of claim 21 further comprising, performing at least one further iteration comprising performing ECC operations on an Nth set of raw data from reading the plurality of bits using an Nth set of reading parameters while reading the plurality of bits according to an N+1th set of reading parameters to obtain an N+1th set of raw data.

* * * * *